United States Patent [19]

Rasmussen

[11] Patent Number: 4,586,989

[45] Date of Patent: May 6, 1986

[54] METHOD OF PLATING A CONDUCTIVE SUBSTRATE SURFACE WITH SILVER

[75] Inventor: Glen L. Rasmussen, Puyallup, Wash.

[73] Assignee: The Boeing Company, Seattle, Wash.

[21] Appl. No.: 731,293

[22] Filed: May 7, 1985

[51] Int. Cl.⁴ .................. C25D 5/02; C25D 5/34; C25D 1/04

[52] U.S. Cl. .................... 204/15; 204/32.1; 204/141.5

[58] Field of Search ............ 204/15, 32.1, 141.5

[56] References Cited

U.S. PATENT DOCUMENTS

| | | | |
|---|---|---|---|
| 2,451,341 | 10/1948 | Jernstedt | 204/44 |
| 2,678,909 | 5/1954 | Jernstedt | 204/41 |
| 3,427,232 | 2/1969 | Natwick | 204/32.1 |
| 3,661,728 | 5/1972 | Toledo | 204/32.1 |
| 3,878,065 | 4/1975 | Carr | 204/32.1 |
| 4,069,110 | 1/1978 | Baboian | 204/141.5 |
| 4,127,450 | 11/1978 | Azzerri | 204/34 |

*Primary Examiner*—T. M. Tufariello
*Attorney, Agent, or Firm*—Schwartz, Jeffery, Schwaab, Mack, Blumenthal & Evans

[57] ABSTRACT

A plated silver layer suitable for use as a bonding layer in thermocompression bonding of composite materials such as multi-layer printed circuit boards is produced on a conductive substrate surface by degreasing, scouring and wiping the surface to clean it after which it is subjected to anodic treatment in a bath of alkaline cyanide solution, rinsed in a bath having the same composition as the anodic treatment bath and then electroplated with silver.

23 Claims, No Drawings

METHOD OF PLATING A CONDUCTIVE SUBSTRATE SURFACE WITH SILVER

The U.S. Government has rights to this invention pursuant to U.S. Navy Contract No. N60530-82-C-0016.

This invention relates to a method of plating a conductive substrate surface with silver. More particularly, the invention relates to plating a substrate surface with a silver layer suitable for silver thermocompression bonding. The presently claimed invention is particularly useful in applying a silver bonding layer over a copper-clad circuit board layer which is to be thermocompression bonded into a multi-layer circuit board composite as described in the copending patent application of King et al., Ser. No. 719,560, filed Mar. 13, 1985, the disclosure of which is incorporated herein by reference.

BACKGROUND OF THE INVENTION

Electroplating is a well established procedure for applying a silver layer over a conductive surface. However, despite the well established nature of the general procedure, it is always a challenge to consistently apply a uniform, smooth, chemically pure silver layer. Even with the exercise of care, consistently reproducible results are not always obtained.

Various techniques have been attempted in the prior art to improve the quality and reproducibility of plated silver layers. Examples of measures utilized in the prior art include periodically reversing the polarity of the plating current during the plating process (U.S. Pat. No. 2,451,341); periodic current reversal combined with agitation of the plating bath (U.S. Pat. No. 2,678,909); plating and then deplating the substrate with a material such as copper from a copper-containing bath prior to transferring the substrate to a plating bath containing the metal ultimately desired to be plated on the substrate (U.S. Pat. No. 3,661,728); anodic cleaning and application of intervening strike layers of silver or other metals with simultaneous plating of a dummy article (U.S. Pat. No. 3,878,065); successive treatment in an anodic alkali hydroxide bath, an acid soaking bath, cathodic activation in a copper bath, and water rinsing prior to silver plating (U.S. Pat. No. 4,069,110); and alternating cathodic and anodic treatment in a neutral electrolyte solution (U.S. Pat. No. 4,127,450).

Despite the development of the art, there has remained a continuing need for improved techniques of applying a plated silver layer onto a conductive surface. The problem is particularly acute in the application of silver layers for silver thermocompression bonding of composite materials such as multi-layer printed circuit boards because the quality and reproducibility of the silver layers have a critical effect on the quality of the bonds produced between layers.

SUMMARY OF THE INVENTION

Accordingly, it is an object of the present invention to provide a method for plating a conductive substrate surface with a uniform, smooth and chemically pure plated silver layer.

A further object of the present invention is to provide a method of plating a conductive substrate with silver which is relatively simple and yields reproducible results.

It is also an object of the present invention to provide a method for plating a conductive substrate surface with silver which provides good adhesion between the plated silver and the substrate surface.

Another object of the present invention is to provide a method which facilitates control of the grain size of silver plated on a conductive substrate surface.

A still further object of the present invention is to provide a method of plating a conductive substrate surface with silver which is particularly suitable for applying a silver bonding layer for themocompression bonding onto a composite material such as a copper-clad printed circuit board.

These and other objects of the invention are achieved by providing a method of plating a conductive substrate surface with silver comprising the steps of cleaning the substrate surface, subjecting the cleaned substrate surface to anodic treatment in a bath of alkaline cyanide solution, rinsing the anodically treated substrate in a second bath having about the same or a similar composition as the bath used for the anodic treatment step, and electroplating the rinsed substrate surface with silver in a third bath containing silver ions.

In further aspects of the invention, the objects are achieved by using an anodic treatment bath having substantially the same composition as the silver plating bath except for the absence of silver ions; the grain size of the electro-deposited silver is controlled by regulating the current density during the plating step; and the substrate is transferred directly from bath to bath while still wet without any intervening water rinsing or drying.

DETAILED DESCRIPTION OF A PREFERRED EMBODIMENT

The conductive substrate surface must first be cleaned. Initially, the substrate surface is subjected to solvent degreasing to remove oil and other soluble organic contaminants. Standard commercially-available degreasing solutions may be used. The substrate surface is thereafter scrubbed to remove any remaining coating or soil. Desirably, scrubbing may be effected by scouring with an abrasive pad. A commerically available scouring pad sold by the 3M Company under the trademark SCOTCHBRITE has proven suitable for the scrubbing step. The substrate surface is thereafter wiped dry with a lint-free pad to remove any scrub residue and to retard oxidation.

The clean substrate surface is then subjected to anodic treatment. This is accomplished by connecting the dry part to the positive terminal of a DC power supply and immersing the substrate in an anodic treatment solution for a suitable period of time. The negative terminal of the power supply is connected to a suitable cathode, such as a stainless steel cathode, which is also immersed in the anodic treatment bath. The applied voltage may range from about 0.1 to about 3 volts. Desirably, the anodic treatment voltage will range from about 0.7 to about 0.8 volts. The duration of the anodic treatment may range from about 5 seconds to about 20 minutes. It is preferred that the duration of the anodic treatment lie in the range from about 1 to about 2 minutes.

The anodic treatment solution desirably has an alkaline pH. Good results have been obtained with anodic treatment solutions comprising an alkali metal carbonate and an alkali metal cyanide dissolved in deionized water. The carbonate concentration may range from about 0.1 Molar to about 2 Molar. The cyanide concentration may range from about 0.1 Molar to about 4 Molar. Advantageously, no silver is included in the anodic treatment solution. It is considered particularly desirable for the composition of the anodic treatment solution to correspond substantially to that of the plating solution used in the silver plating step except for the absence of silver therefrom. The anodic treatment results in a nascent surface which is uniformly receptive to silver plating.

Following the anodic treatment, the treated substrate is withdrawn from the anodic treatment bath and without any intervening water rinsing or any delay which would permit drying of the treated surface, the substrate is directly immersed while still wet in a second solution having substantially the same composition as the solution used in the anodic treatment step. This step, which takes about 5 seconds to 20 minutes, and preferable about 30 to 60 seconds, removes any metal ions which may have been released into the anodic treatment solution during the anodic treatment and which might contaminate the silver plating solution. Chemical imbalance in the silver plating solution due to drag-in of metal ions or other contaminants is thus avoided. This rinsing step also serves to maintain the nascent surface conditions established in the anodic treatment step.

The rinsed substrate is then withdrawn from the rinsing bath and again is directly transferred without intervening water rinsing or drying to a silver plating bath. Prior to immersion in the plating bath, the substrate is cathodically connected to the plating power supply. High purity silver anodes, preferably containing 999.5 plus fine min. silver, are also connected to the power supply and immersed in the plating solution.

A preferred plating bath solution comprises from about 0.1 to about 3 Molar silver cyanide, from about 0.1 to about 4 Molar potassium cyanide and from about 0.1 to about 2 Molar potassium carbonate in deionized water. Desirably, reagent or purified grade chemicals are utilized to make up the plating bath. If desired, conventional brighteners may also be added to the plating bath, but this is ordinarily unnecessary. The temperature of the silver plating bath may desirably be maintained at ambient room temperature, e.g., in the range from about 70° to about 90° F.

Plating is effected at a current density in the range from about 0.1 to about 20 ampres per square foot. Preferably, the current density will lie in the range from about 1 to about 10 ampres per square foot. Particularly good results have been achieved with a current density of approximately 4 ampres per square foot. The silver grain size of the electrodeposited silver is a function of the current density. Tests in which plating was effected onto a copper surface from a plating bath containing 0.22 Molar silver cyanide, 0.80 Molar potassium cyanide have shown that the grain size of the deposited silver can be varied by regulating the current density at which plating is effected as shown in the following table:

| Current Density (Amps per square foot) | Approximate Grain Size ($10^{-6}$ inch) |
| --- | --- |
| 1 | 250 |
| 2 | 170 |
| 4 | 50 |
| 8 | 15 |

| Current Density (Amps per square foot) | Approximate Grain Size ($10^{-6}$ inch) |
| --- | --- |
| 16 | burned |

Electroplating is continued until the plated silver layer has the desired thickness. In accordance with the invention, highly uniform and smooth plated layers of substantially pure silver can be produced having a thickness of 2 mil or greater. The plated silver layer may have a matte, bright or semi-bright finish. Particularly good bonding results have been achieved in thermocompression bonding with matte finish layers.

During plating, the silver plating solution may be circulated between the plating bath and a filter unit. This may be achieved, for example, by continuously pumping a small amount of plating solution from the plating bath, forcing it through a filter and then returning the filtered plating solution to the plating bath. Desirably, the rate of circulation will be sufficient to provide a mild agitation of the plating bath during the plating step. In this way, the tendency is reduced for a localized depletion of silver ions to occur in the vicinity of the plated surface.

The invention will be described in further detail hereinafter with reference to the following non-limiting example of the application of a silver bonding layer for thermocompression bonding of a copper-clad circuit board layer in a multi-layer plated through hole printed circuit board. It should be understood, however, that the method of the invention is useful in applying layers of silver to other substrates and that the resulting silver layers may be used for purposes other than as bonding layers for thermocompression bonding.

EXAMPLE

A fiberglass-reinforced polytetrafluoroethylene circuit board covered with copper was solvent degreased and then scrubbed with a commercially available scouring pad sold by the 3M Corporation under the trademark SCOTCHBRITE. After the surface had been thoroughly scrubbed, it was wiped clean and dry with a soft lint-free pad. The copper-clad circuit board was then anodically connected and was immersed in an anodic treatment bath consisting of 7 ounces potassium cyanide and 5 ounces potassium carbonate in 1 gallon of deionized water. Anodic treatment was effected at approximately 0.7 to 0.8 volts for between 1 and 2 minutes. Following the anodic treatment, the circuit board was disconnected and immediately immersed in a rinsing bath having the same composition as the anodizing bath. The circuit board was then cathodically connected and tranferred without delay from the rinsing bath while still wet directly to a plating bath consisting of 4 ounces silver cyanide, 7 ounces potassium cyanide and 5 ounces potassium carbonate in 1 gallon deionized water. Anodes of 999.5 plus fine min silver were immersed in the plating bath, and plating was effected at a current density of approximately 4 amps per square foot. The silver anodes were provided with cotton anode bags which assist in preventing fouling. The plating bath was maintained at ambient temperature in the range between about 70° and about 90° F. During plating, a portion of the plating solution was continuously withdrawn, pumped through a polypropylene filter and then returned to the plating bath. Circulation of a portion of the plating solution through the filter system resulted in mild agitation of the plating solution. After approximately 3 hours, a smooth, uniform plated layer of substantially pure silver with a matte finish was obtained over the copper of the circuit board. In subsequent thermocompression bonding tests, this plated layer produced excellent bonding results.

The foregoing description has been set forth merely to illustrate the invention and is not intended to be limiting. Since modifications of the described embodiments incorporating the spirit and substance of the invention may occur to persons skilled in the art, the scope of the invention should be limited solely with respect to the appended claims and equivalents.

I claim:

1. A method of plating a conductive substrate surface with silver comprising the steps of:
    cleaning the substrate surface;
    subjecting the clean substrate surface to anodic treatment in a bath of alkaline cyanide solution;
    rinsing the anodically treated substrate in a second bath having about the same composition as the bath used for the anodic treatment step; and
    electroplating the rinsed substrate surface with silver in a silver ion containing plating solution.

2. A method as recited in claim 1, wherein the bath used for the anodic treatment step comprises alkali metal cyanide and alkali metal carbonate in deionized water.

3. A method as recited in claim 2, wherein the bath used for the anodic treatment step contains from about 0.1 to about 4 Molar potassium cyanide and from about 0.1 to about 2 Molar potassium carbonate.

4. A method as recited in claim 1, wherein said anodic treatment is effected at a voltage in the range from about 0.1 to about 3 volts for a time from about 5 seconds to about 20 minutes.

5. A method as recited in claim 4, wherein said anodic treatment is effected at a voltage in the range from about 0.7 to about 0.8 volts for a time from about 1 to about 2 minutes.

6. A method as recited in claim 1, wherein said cleaning step comprises degreasing and scouring the conductive surface of the substrate.

7. A method as recited in claim 6, wherein said cleaning step comprises:
    solvent degreasing the conductive surface;
    scouring the degreased surface; and
    wiping the scoured surface to provide a dry, lint-free surface.

8. A method as recited in claim 1, wherein the substrate is transferred directly from the anodic treatment bath to the rinse bath while still wet without intervening rinsing or drying.

9. A method as recited in claim 2, wherein said anodic treatment bath is silver-free.

10. A method as recited in claim 1, wherein said conductive surface is a copper surface.

11. A method as recited in claim 10, wherein said substrate is a copper-clad circuit board.

12. A method as recited in claim 9, wherein the silver plating bath has substantially the same composition as the anodic treatment bath except for the additional presence of dissolved silver salt.

13. A method as recited in claim 1, wherein said silver plating bath comprises from about 0.1 to about 3 Molar silver cyanide, from about 0.1 to about 4 Molar potassium cyanide and from about 0.1 to about 2 Molar potassium carbonate in deionized water.

14. A method as recited in claim 1, wherein said silver plating bath consists of silver cyanide, potassium cyanide and potassium carbonate in deionized water.

15. A method as recited in claim 1, wherein silver plating is effected at a current density ranging from about 0.1 to about 20 ampres per square foot.

16. A method as recited in claim 15, wherein silver plating is effected at a current density in the range from about 1 to about 10 ampres per square foot.

17. A method as recited in claim 1, wherein silver plating is effected at a temperature in the range from about 70 to about 90 degrees Fahrenheit.

18. A method as recited in claim 1, wherein silver plating is continued for sufficient time to deposit a plated silver layer having a thickness of at least about 2 mil.

19. A method as recited in claim 1, further comprising the step of regulating the current density of the plating current during the silver plating step to control the grain size of the deposited silver.

20. A method as recited in claim 1, wherein silver plating solution is circulated between the plating bath and a filter during the plating step.

21. A method as recited in claim 20, wherein the silver plating solution is continuously withdrawn from the plating bath, filtered and returned to the plating bath at a rate sufficient to provide mild agitation of the plating bath during the plating step.

22. A method as recited in claim 1, wherein the rinsed substrate is transferred directly from the bath used in the rinsing step to the silver plating bath while still wet without any intervening rinsing or drying.

23. A method of silver plating a conductive copper surface on a copper-clad composite circuit board, comprising the steps of:
    cleaning the clad surface of the board by the substeps of degreasing, scouring, and drying the surface;
    subjecting the clean surface to anodic treatment in an alkaline bath containing about 0.1 to 4.0 M alkali cyanide and about 0.1 to 2.0 M alkali carbonate in deionized water, the bath being essentially free of silver, the anodic treatment occurring at an applied voltage of between about 0.1 to 3.0 volts for about 1 to 2 minutes;
    removing the board from the alkaline bath and disconnecting the board;
    rinsing the board in a second bath having about the same composition as the anodic treatment bath to remove metal ions from the board which might contaminate the silver plating bath;
    removing the board from the second bath;
    connecting the board to make the clad surface cathodic;
    immediately immersing the board into a plating bath without drying or rinsing the board;
    silver plating the surface in the plating bath, the bath being made up with substantially the same amounts of alkali cyanide and alkali carbonate in deionized water as the rinsing bath and further containing about 0.1 to 3.0 M silver cyanide, the plating occurring at a current density of between about 1 to 8 amps/ft$^2$ to control the grain size of the silver plate between about $15 \times 10^{-6}$ and $250 \times 10^{-6}$ inch, the plating continuing to deposit substantially pure silver in a uniform layer on the copper surface.

* * * * *